(12) United States Patent
Mizusaki et al.

(10) Patent No.: US 8,373,258 B2
(45) Date of Patent: Feb. 12, 2013

(54) SEMICONDUCTOR DEVICE AND PRODUCTION METHOD THEREOF

(75) Inventors: Shinya Mizusaki, Kanagawa (JP); Kazuya Fukuhara, Kanagawa (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 0 days.

(21) Appl. No.: 13/118,401

(22) Filed: May 28, 2011

(65) Prior Publication Data

US 2011/0298116 A1    Dec. 8, 2011

(30) Foreign Application Priority Data

Jun. 3, 2010    (JP) .................................. 2010-127422

(51) Int. Cl.
*H01L 23/495*    (2006.01)
*H01L 21/56*    (2006.01)
*H01L 21/50*    (2006.01)
*H01L 21/44*    (2006.01)

(52) U.S. Cl. ................ 257/676; 257/666; 257/E23.037; 257/E23.031; 257/E21.502; 438/123; 438/112; 438/124

(58) Field of Classification Search .................. 257/676, 257/666, E23.037, E23.031, E21.502; 438/123, 438/112, 124
See application file for complete search history.

(56) References Cited

U.S. PATENT DOCUMENTS

| 5,952,711 | A  | * | 9/1999 | Wohlin et al. ................. 257/668 |
| 6,611,047 | B2 | * | 8/2003 | Hu et al. ........................ 257/666 |
| 7,145,222 | B2 | * | 12/2006 | Gai ................................. 257/667 |
| 7,262,491 | B2 | * | 8/2007 | Islam et al. ..................... 257/670 |
| 7,808,089 | B2 | * | 10/2010 | Nguyen et al. ................. 257/676 |
| 7,821,113 | B2 | * | 10/2010 | Sahasrabudhe et al. ....... 257/666 |
| 2005/0026323 | A1 |   | 2/2005 | Wada et al. |
| 2005/0275077 | A1 | * | 12/2005 | Tan et al. ....................... 257/678 |
| 2010/0052149 | A1 | * | 3/2010 | Nose et al. ..................... 257/692 |

FOREIGN PATENT DOCUMENTS

JP    2006-303517 A    11/2006

* cited by examiner

*Primary Examiner* — Luan C Thai
(74) *Attorney, Agent, or Firm* — Miles and Stockbridge P.C.

(57) ABSTRACT

An object of the present invention is to improve the quality control of a semiconductor device. By forming an inscription comprising a culled or pixel skipping pattern of dimples on the upper surface of a die pad in a QFN, it is possible to confirm the inscription by X-ray inspection or the like even after individuation and specify a cavity of a resin molding die. Further, it is possible to specify the position of a device region in a lead frame. As a result, when a defect appears, it is possible to sort a defective QFN by appearance inspection and improve quality control in the assembly of a QFN.

12 Claims, 13 Drawing Sheets

1 : QFN (SEMICONDUCTOR DEVICE)
2 : SEMICONDUCTOR CHIP
5a : LEAD
5d : DIE PAD (CHIP MOUNTING PORTION)
5e : UPPER SURFACE
5g : SUSPENSION LEAD
5h : DIMPLE
5i : CULLED OR PIXEL SKIPPING PATTERN (INSCRIPTION)

1 : QFN (SEMICONDUCTOR DEVICE)
2 : SEMICONDUCTOR CHIP
5a : LEAD
5d : DIE PAD (CHIP MOUNTING PORTION)
5e : UPPER SURFACE
5g : SUSPENSION LEAD
5h : DIMPLE
5i : CULLED OR PIXEL SKIPPING PATTERN (INSCRIPTION)

SEMICONDUCTOR DEVICE AND PRODUCTION METHOD THEREOF

CROSS-REFERENCE TO RELATED APPLICATIONS

The disclosure of Japanese Patent Application No. 2010-127422 filed on Jun. 3, 2010 including the specification, drawings and abstract is incorporated herein by reference in its entirety.

BACKGROUND

The present invention relates to a semiconductor device and a production method thereof; in particular a technology effective when it is applied to a semiconductor device assembled with a lead frame by a MAP method A technology of giving address information patterns to resin seal type semiconductor devices respectively in advance of a process to divide a matrix substrate into plural pieces in a method of producing a semiconductor device using a wiring substrate is described (for example, refer to Patent literature 1).

PATENT LITERATURE

Patent Literature 1

Japanese Unexamined Patent Publication No. 2006-303517

SUMMARY

A QFN (Quad Flat Non-leaded Package) is known as an example of a small semiconductor device (a semiconductor package) assembled with a lead frame. As methods of resin molding applied at a resin sealing process in the assembly of a semiconductor device, there are two methods; an individual piece molding method and a MAP (Mold Array Package) method.

The individual piece molding method is a method of applying resin molding by matching a sealing body of a semiconductor device with a cavity of a resin molding die one-to-one. In the individual piece molding method therefore, it is possible to identify a cavity with which resin molding is applied even after individuation by inscribing a cavity number of a resin molding die.

Meanwhile, the MAP method is a method of applying resin molding by covering a plurality of device regions in a lump with one cavity of a resin molding die. Consequently, it is possible to increase the number of divisions per one lead frame by arraying device regions closely to each other and hence it is considered to be effective to adopt the method in assembling a small semiconductor device such as a QFN.

In the case of the MAP method however, since an identical die is used in resin molding regardless of a package size, it, is impossible to inscribe a cavity number with a resin molding die. A problem when a cavity number is not inscribed therefore is that the cavity of a product (a semiconductor device) cannot be specified after individuation.

Moreover with regard to a semiconductor device after individuation, another arising problem is that the location of a device region in a lead frame cannot be specified.

A challenge therefore is that, when a defect occurs, the cause can hardly be pursued.

Here, Patent literature 1 (Japanese Unexamined Patent Publication No. 2006-303517) describes the assembly of a semiconductor device that adopts a MAP method and uses a wiring substrate.

The present invention has been established in view of the above problems and an object of the present invention is to provide a technology that allows the quality control of a semiconductor device to improve.

The above and further objects and novel features of the present invention will appear from the description and the accompanying drawings in the present specification.

The representative outline of the invention disclosed in the present application is briefly explained as follows.

A semiconductor device according to a representative embodiment includes: a semiconductor chip having a main surface, a rear surface on the other side of the main surface, and a plurality of surface electrodes formed over the main surface; a sheet-shaped chip mounting portion having a upper surface over which the semiconductor chip is mounted with a die bond material interposed in between and a lower surface on the other side of the upper surface; a plurality of leads being formed at the periphery of the chip mounting portion and having inner portions and outer portions respectively; a plurality of conductive wires electrically coupling the plural leads to the plural surface electrodes of the semiconductor chip respectively; and a sealing body to seal the semiconductor chip, the respective inner portions of the plural leads, and the plural conductive wires with resin, and, in the semiconductor device, the respective outer portions of the plural leads are exposed through the rear surface of the sealing body and an inscription is formed on the upper surface of the chip mounting portion.

Further, a method for producing a semiconductor device according to a representative embodiment includes the processes of (a) preparing a lead frame having a plurality of device regions each of which includes a chip mounting portion on the upper surface of which an inscription is formed and a plurality of leads disposed at the periphery of the chip mounting portion, (b) mounting a semiconductor chip over the upper surface of each of the plural chip mounting portions with a die bond material interposed in between, (c) electrically coupling surface electrodes of the semiconductor chip to the leads through conductive wires, (d) forming a packaged sealing body by covering the plural device regions in the lead frame with one cavity of a resin molding die and sealing them with resin, and (e) dividing and individuating the packaged sealing body into individual semiconductor devices, and, by the method, the semiconductor device is assembled with the lead frame having the chip mounting portion on the upper surface of which the inscription is formed.

The representative effect of the invention disclosed in the present application is briefly explained as follows.

It is possible to improve quality control in the assembly of a semiconductor device.

DETAILED DESCRIPTION

In the following embodiments, explanations on an identical part or similar parts are not repeated in principle except when the explanations are specifically necessary.

In the following embodiments further, explanations are divided into plural sections or embodiments for convenience sake if necessary but they are not unrelated to each other except otherwise specified and one of the parts of a single case is a modified example, a detail, a supplemental explanation, or the like of another part or the whole parts thereof.

In the following embodiments furthermore, when a number or the like of a component (a number of pieces, a numerical value, a quantity, a range, etc.) is referred to, the number is not limited to the specific number and may be a number higher or lower than the specific number except when it is particularly specified or when the number is obviously limited to the specific number in principle.

In the following embodiments furthermore, it goes without saying that the constituent components (including component steps and others) are not always essential except when it is particularly specified or when it is obviously thought to be essential in principle.

In the following embodiments furthermore, it goes without saying that, when the terms "comprising A", "being composed of A", "having A", and "including A" are cited with regard to a constituent component or the like, it does not mean that a component other than the component is excluded except when it is specified that the component is obviously limited to the specific component. In the following embodiments likewise, when the shape, the positional relationship, or the like of a constituent component or the like is cited, it means that a shape or the like substantially close or similar to the shape or the like is included except when it is particularly specified otherwise or when it is thought to be obviously otherwise in principle. This is applied also to a numerical value and a range described above in the same way.

Embodiments according to the present invention are hereunder explained in detail on the basis of the drawings. Here, in all the drawings for the explanations of the embodiments, an identical symbol is given to members having identical functions and the repetition of the explanations is omitted.

Embodiment 1

Figure 1:
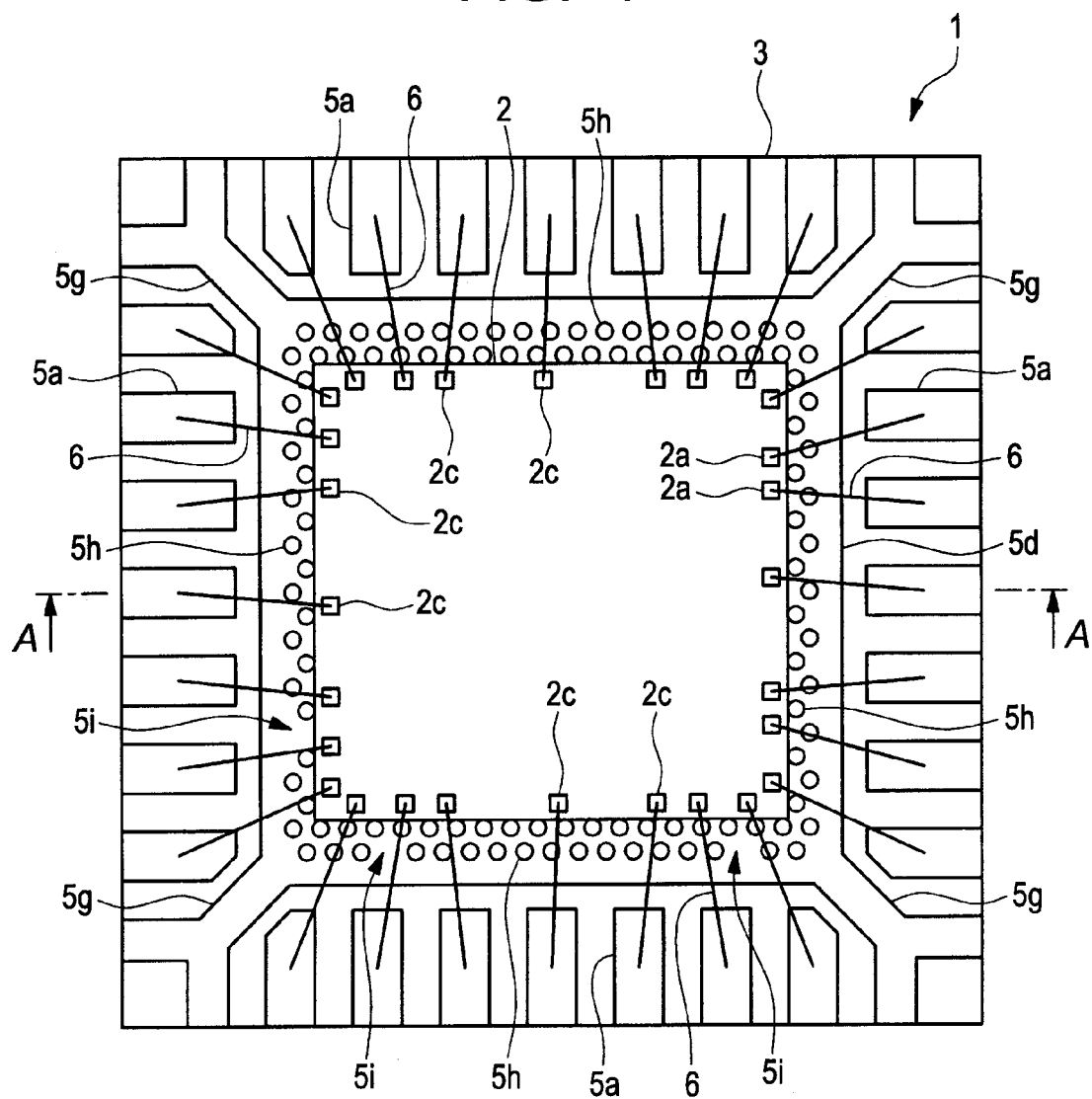
FIG. 1 is a plan view, being viewed through a sealing body, showing an example of the structure of a semiconductor device according to Embodiment 1 of the present invention.
Figure 2:
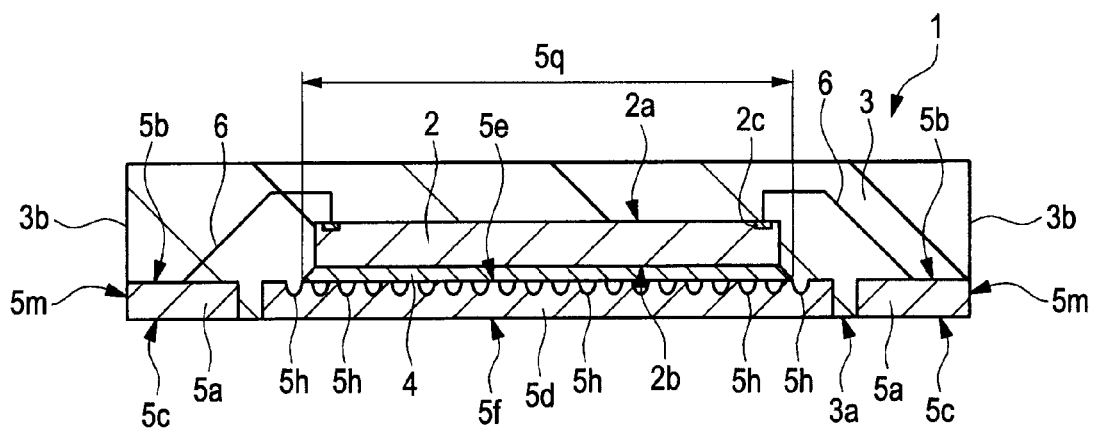
FIG. 2 is a sectional view showing a structure cut on line A-A shown in FIG. 1.
Figure 3:
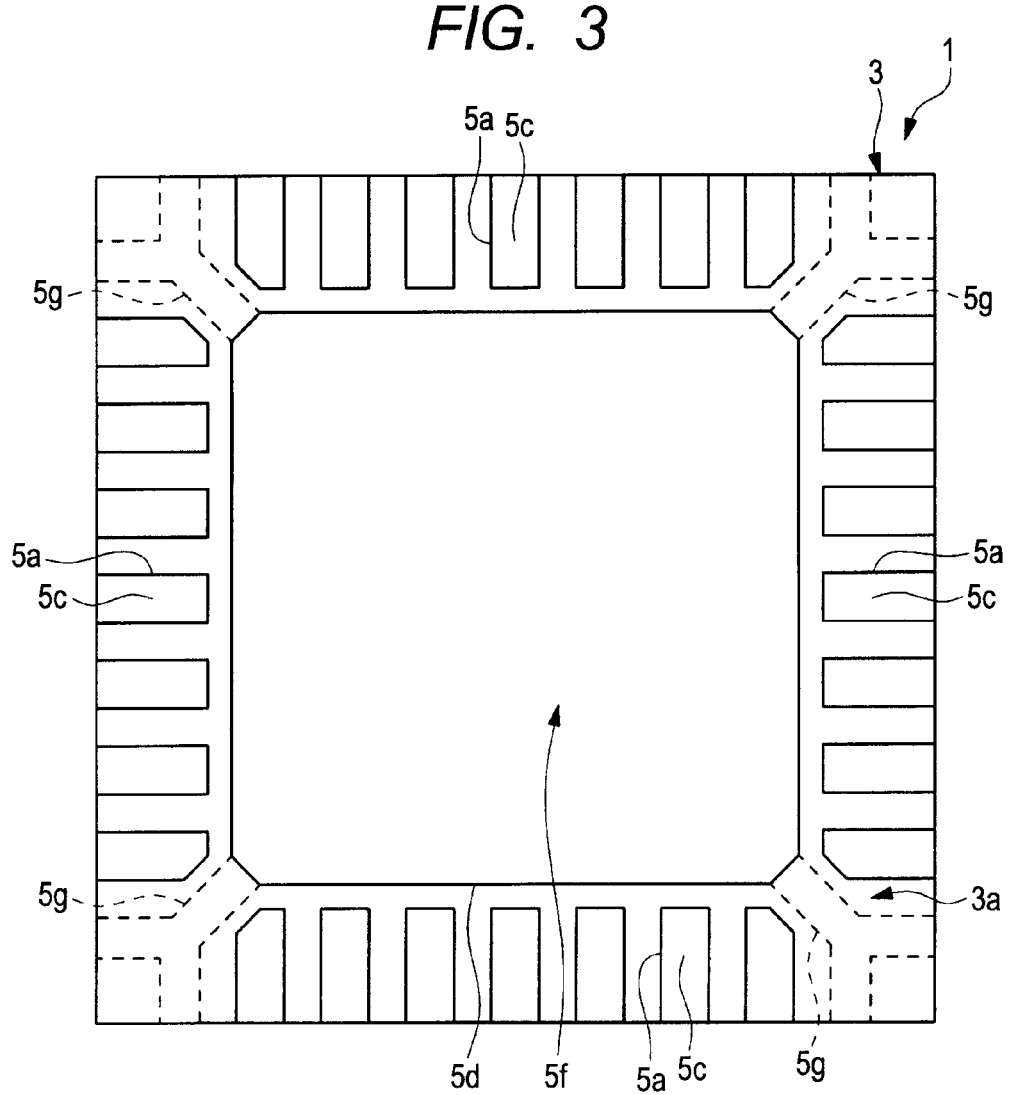
FIG. 3 is a bottom view showing an example of the structure on the bottom side of the semiconductor device shown in FIG. 1.
Figure 4:
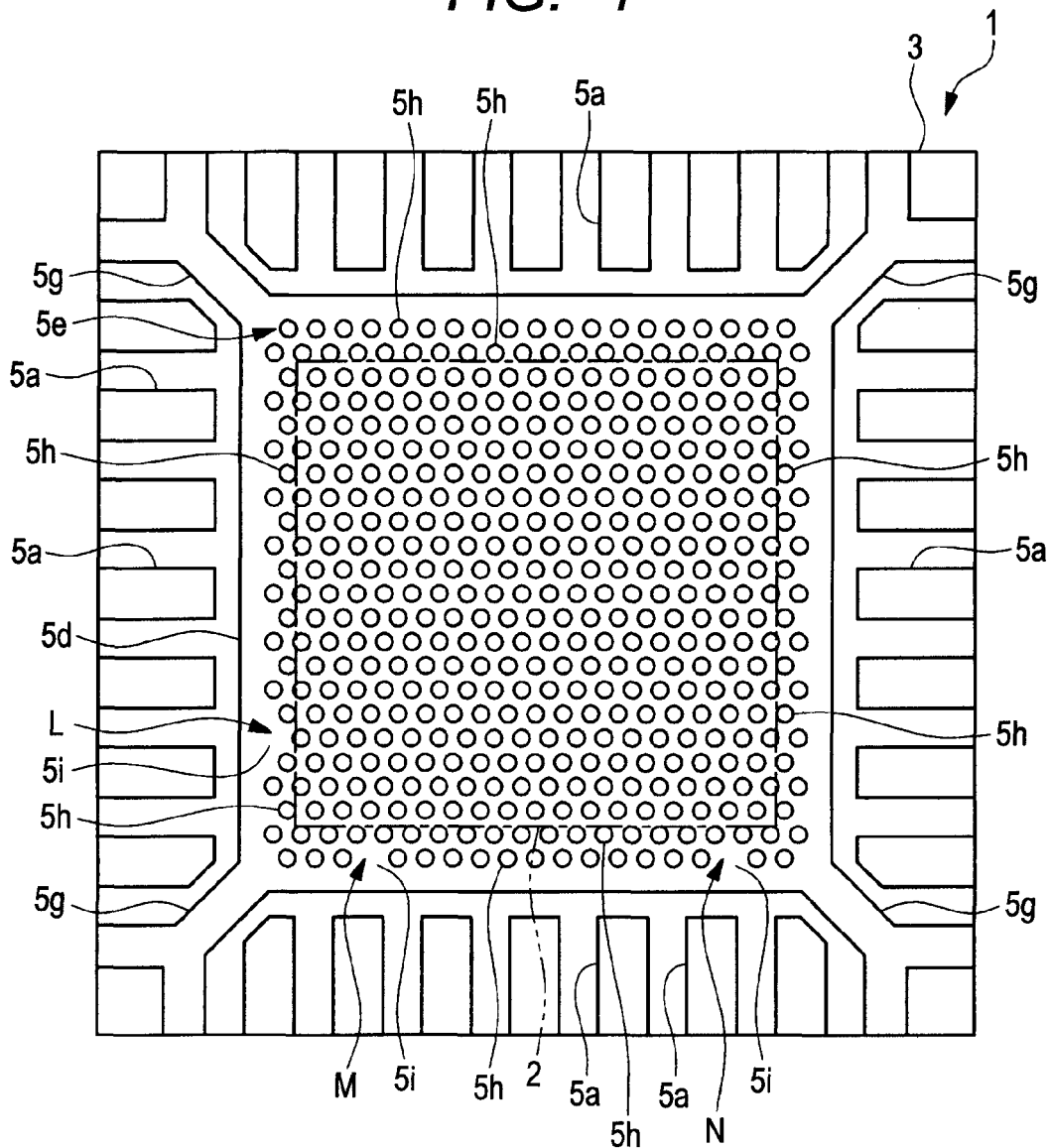
FIG. 4 is a plan view showing an example of the shape of an inscription in the semiconductor device shown in FIG. 1.

FIG. 1 is a plan view, being viewed through a sealing body, showing an example of the structure of a semiconductor device according to Embodiment 1 of the present invention, FIG. 2 is a sectional view showing a structure cut on line A-A shown in FIG. 1, FIG. 3 is a bottom view showing an example of the structure on the bottom side of the semiconductor device shown in FIG. 1, and FIG. 4 is a plan view showing an example of the shape of an inscription in the semiconductor device shown in FIG. 1.

A semiconductor device according to Embodiment 1 is a device that is assembled by adopting a MAP method and using a lead frame. In Embodiment 1, explanations are made by picking up a QFN 1, which is a surface mounting type, a resin sealing type, and also a small semiconductor package as shown in FIG. 1, as an example of the semiconductor device.

A QFN 1 is configured so that: a plurality of leads 5a disposed around a semiconductor chip 2 may be formed in the manner of extending and dispersing in four directions; and also, as shown in FIG. 3, the leads 5a may be exposed as externally coupling terminals at the periphery of the lower surface 3a of a sealing body 3.

The detailed configuration of the QFN 1 shown in FIG. 1 to 3 is explained as follows. A semiconductor chip 2 incorporated into the QFN 1 has a main surface 2a and a rear surface 2b on the other side of the main surface 2a and electrode pads 2c that are a plurality of surface electrodes are formed over the main surface 2a. Further, the semiconductor chip 2 is disposed nearly in the center of a sealing body 3 in the planar directions in the state of being mounted over the upper surface 5e of a die pad (also called a tab) 5d that is a metal-made sheet-shaped chip mounting portion and the rear surface 2b is fastened to the upper surface 5e of the die pad 5d with a die bond material interposed in between.

As the die bond material for example, a paste material 4 such as a silver paste is preferably adopted. Further, as the die pad 5d, a so-called "large tab structure" meaning that the size of the upper surface 5e is larger than the size of the semiconductor chip 2 is adopted. Here, the die pad 5d has the upper surface 5e over which the semiconductor chip 2 is mounted and a lower surface 5f on the other side of the upper surface 5e and the lower surface 5f is exposed through the rear surface 3a of the sealing body 3 as shown in FIG. 3. Further, the die pad 5d is supported by four suspension leads 5g that are formed integrally with the die pad 5d and extend in the directions of the corners of the sealing body 3.

Further, a plurality of leads 5a are disposed at nearly equal intervals around the die pad 5d over which the semiconductor chip 2 is mounted. That is, a plurality of leads 5a are disposed in each of the four regions formed by being partitioned with the four suspension leads 5g extending in the diagonal directions in a plan view of the QFN 1. Each of the leads 5a has an inner portion 5b and an outer portion 5c and the inner portion 5b is the portion covered with a resin for sealing and embedded into the interior of the sealing body 3 and the outer portion 5c is the portion exposed through the lower surface 3a of the sealing body 3 as an externally coupling terminal.

Here, at the outer portion 5c of each of the leads 5a exposed through the lower surface 3a of the sealing body 3, plating of tin-bismuth for example is formed as exterior plating.

Further, an end (on the side closer to the semiconductor chip 2) of each of the leads 5a is electrically coupled town electrode pad 2c that is a surface electrode on the main surface 2a of the semiconductor chip 2 with a conductive wire 6 such as a gold wire interposed in between and the other end on the other side is disposed on the side of a side surface 3b of the sealing body 3. Furthermore, a cut surface 5m of each of the leads 5a is exposed through the side surface 3b of the sealing body 3 and forms an end as shown in FIG. 2.

Here, each lead 5a is made of an alloy identical to the die pad 5d, the suspension leads 5g, and the like and of a copper alloy for example and the thickness thereof is about 0.15 to 0.2 mm for example.

Further, the plural conductive wires 6 are the wires to electrically couple the plural leads 5a to the plural electrode pads 2c of the semiconductor chip 2.

Further, the sealing body 3 formed with a resin for sealing is a substance to seal the semiconductor chip 2, the respective inner portions 5b of the plural leads 5a, and the plural conductive wires 6 with a resin and the resin for sealing is an epoxy thermosetting resin for example.

In the QFN 1 according to Embodiment 1, an inscription is formed on the upper surface 5e of the die pad 5d over which the semiconductor chip 2 is mounted. The inscription represents a cavity number of a resin molding die 8 used at a resin sealing process and shown in FIG. 15 and a package position on a frame in a cavity 8c, for example.

For example, in the QFN 1 according to Embodiment 1, a plurality of dimples (dents) 5h are formed in a lattice-shaped array on the upper surface 5e of the die pad 5d as shown in FIGS. 1 and 4 and, in the plural dimples 5h formed in line at the outermost periphery outside the semiconductor chip 2 out of the plural dimples 5h, a culled or pixel skipping pattern 5i of the dimple array functions as a mark (an inscription).

That is, in the QFN 1 according to Embodiment 1, a plurality of dimples 5h are formed in a lattice-shaped array in the region corresponding to the lower surface 2b of the semiconductor chip 2 on the upper surface 5e of the die pad 5d and the plural dimples 5h are formed as an inscription in the region outside the semiconductor chip 2, preferably at the outermost periphery that is a position outside the coating region 5q of a paste material 4 for die bonding as shown in FIG. 2.

By forming the plural dimples 5h in the region corresponding to the lower surface 2b of the semiconductor chip 2 on the upper surface 5e of the die pad 5d as stated above, the paste material 4 that is a die bond material enters into the plural dimples 5h and hence it is possible to enhance the adhesiveness between the paste material 4 and the die pad 5d. Further, by forming the plural dimples 5h as an inscription at positions outside the coating region 5q of the paste material 4 (for example, the outermost periphery), even though a culled or pixel skipping pattern 5i of the dimples 5h is formed, it has nothing to do with the adhesiveness with the paste material 4 as long as the positions are outside the coating region 5q of the paste material 4 and hence it is possible to inhibit the adhesiveness between the paste material 4 and the die pad 5d from deteriorating.

That is, in consideration of the adhesiveness between the paste material 4 and the die pad 5d in the coating region 5q of the paste material 4, it is preferable that the culled or pixel skipping pattern 5i of the dimples 5h does not exist in the coating region 5q of the paste material 4 and hence it is more effective to form the culled or pixel skipping pattern 5i of the dimples 5h at a position outside the coating region 5q of the paste material 4 (for example, the outermost periphery).

Here, in the QFN 1, as shown at the sections L, M, and N in FIG. 4, a culled or pixel skipping pattern 5i (sites where dimples 5h are not formed): is formed in the allocation of the plural dimples 5h formed in a regularly aligned manner at an outermost peripheral position outside the semiconductor chip 2; and is used as a mark (an inscription).

Figure 15:
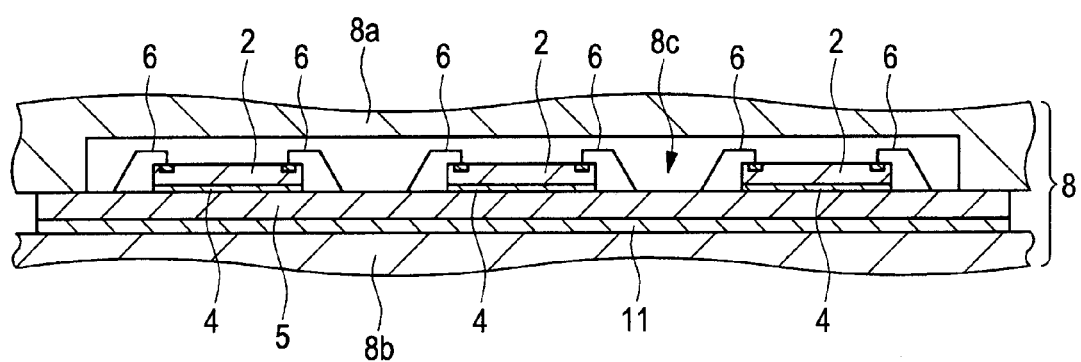
FIG. 15 is a partial sectional view showing an example of the structure at die cramping during a resin sealing process in the assembly of the semiconductor device shown in FIG. 1.

In the case of the inscription shown in FIG. 4 for example, the sections L and M represent package positional information on a frame (the positional information of a semiconductor device in a cavity 8c of a resin molding die 8 shown in FIG. 15) respectively and the section N represents cavity information.

Firstly, at the section L, the third dimple 5h from the bottom is culled and not formed. On this occasion, "the third package position from the bottom in the Y direction" is meant. Then, at the section M in FIG. 4, the fourth dimple 5h from the observers' left is culled and not formed. On this occasion, "the fourth package position from the observers' left in the X direction" is meant. Further, at the section N in FIG. 4, the third dimple 5h from the observers' right is culled and not formed. On this occasion, "the third cavity from the observers' right" is meant.

Figure 5:
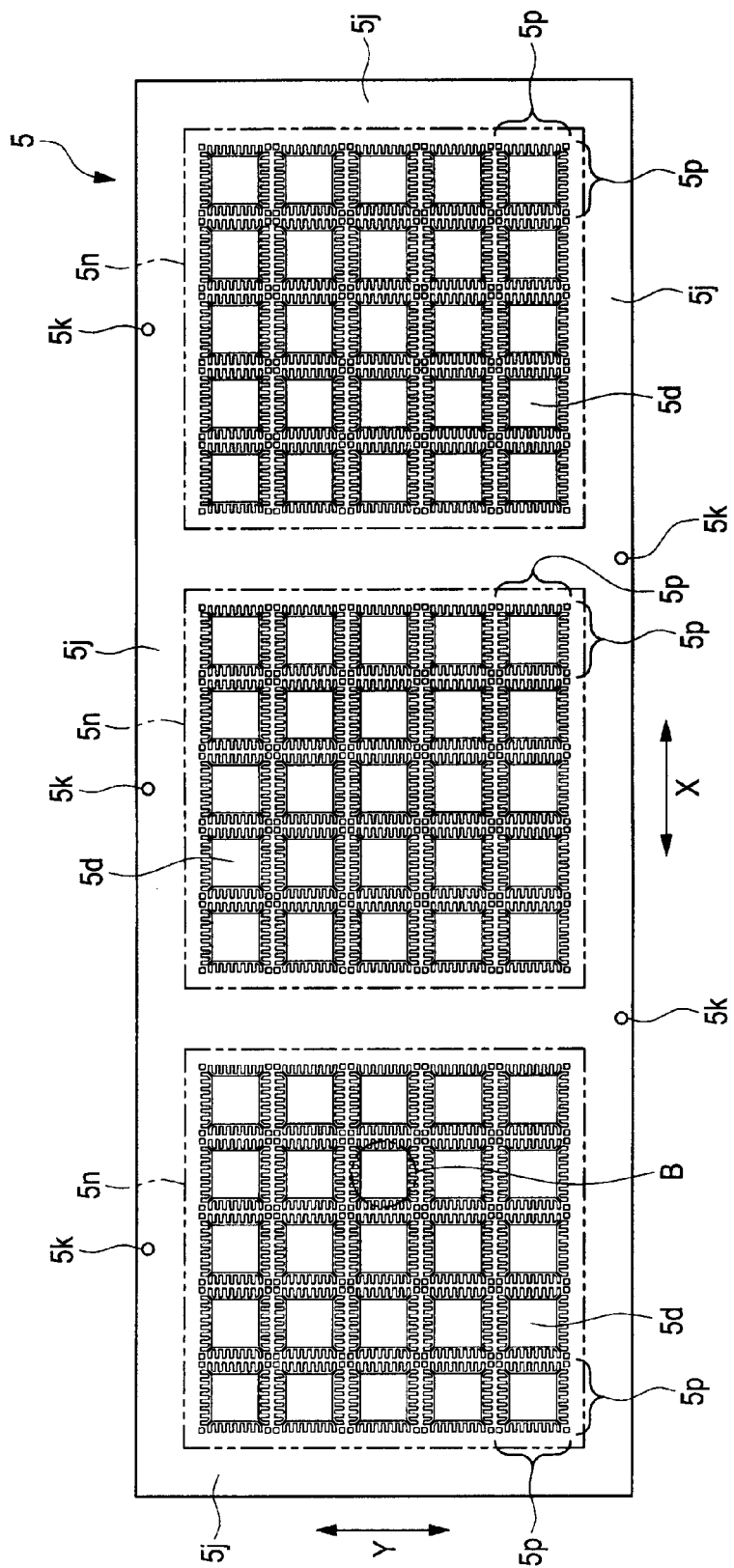
FIG. 5 is a plan view showing an example of the structure of a lead frame used in the assembly of the semiconductor device shown in FIG. 1.

That is, when the information of the culled or pixel skipping pattern 5i of the dimples 5h at the sections L, M, and N shown in FIG. 4 is matched to one lead frame 5 shown in FIG. 5, it means: in the mold region 5n corresponding to the third cavity from the right as shown by the section N, the fourth package position (a device region 5p) from the left in the X direction as shown by the section M and the third package position (a device region 5p) from the bottom in the Y direction as shown by the section L; and thus the device region 5p (the package position) of the section B in FIG. 5.

By giving an inscription with dimples 5h on the upper surface 5e of a die pad 5d in this way, it is possible to know package positional information (positional information of a semiconductor device (a device region 5p)) and cavity information on a lead frame 5 even after individuation.

Here, the plural dimples 5h are formed preferably by etching but may also be formed by stamping or the like other than etching.

Further, the QFN 1 has four suspension leads 5g leading to the die pad 5d and the suspension leads 5g are not exposed through the rear surface 3a of the sealing body 3 as shown in FIG. 3. That is, the four suspension leads 5g leading to the corner portions of the die pad 5d and extending in, the diagonal directions of the sealing body 3 in the plan view are not exposed through the rear surface 3a of the sealing body 3 and are embedded into the sealing body 3. The lead thickness is reduced to about a half by shaving the suspension leads 5g from the rear surface side by half etching and thereby the suspension leads 5g are embedded into the sealing body 3.

Here, the reason why the suspension leads 5g are not exposed through the rear surface 3a of the sealing body 3 but embedded into the sealing body 3 is that the adjacent leads 5a are disposed very close to the suspension leads 5g in the vicinities of the suspension leads 5g at the package corner portions in the row of the leads aligned at the periphery of the rear surface 3a of the sealing body 3. On this occasion, it sometimes happens that a suspension lead 5g and a lead 5a may form a solder bridge when the QFN 1 is mounted by soldering and hence the suspension leads 5g are embedded into the sealing body 3 in order to avoid the occurrence of the solder bridge. That is, by applying half etching to the suspension leads 5g, embedding the suspension leads 5g into the sealing body 3, and thus avoiding exposing the suspension leads 5g through the rear surface 3a of the sealing body 3, it is possible to prevent a solder bridge from occurring at a package corner portion.

On this occasion, the suspension leads 5g are formed so as to have about half the thickness of the leads 5a by half etching. Consequently, in the QFN 1, it is difficult to form an inscription and a dimple 5h on a suspension lead 5g from the viewpoint of thickness and hence neither an inscription nor a dimple 5h is formed.

By the QFN 1 according to Embodiment 1, an inscription representing the positional information of a package, the positional information of a cavity 8c, and the like is formed on the upper surface 5e of the die pad 5d and hence it is possible to confirm the inscription by X-ray inspection or the like and identify a cavity 8c of a resin molding die 8 even after the individuation of packages. Further, it is possible also to identify the position of a device region 5p (a package position) in a lead frame 5.

By so doing, it is possible to sort a defective QFN 1 by appearance inspection when a defect appears in the assembly of a QFN (a semiconductor device) 1 and it is possible to improve quality control in the assembly of a QFN 1. Further, it is possible to confirm history and trends at each of the processes of the QFN 1 where a defect appears.

Further, since the inscription is formed with the dimples 5h, the inscription does not easily disappear unlike marking and can be easily recognized also from above the sealing body 3 and the semiconductor chip 2 by X-ray transmission even after the individuation of packages.

Furthermore, since the plural dimples 5h are formed on the upper surface 5e of the die pad 5d in the region of the chip lower portion (the region corresponding to the rear surface 2b of the semiconductor chip 2) and the die bond material is embedded into the dimples, it is possible to improve the adhesiveness between the die bond material and the die pad 5d. The effect is more conspicuous when a paste material 4 such as a silver paste is used as the die bond material.

Moreover, since an inscription is formed with dimples (dents) 5h and the dimples 5h are formed by etching, it is possible to easily form the dimples 5h at an identical process when the lead pattern of a lead frame 5 is formed.

Additionally, since an inscription is formed into the shape of dimples 5h by etching, it is possible to form the dimples with a mask pattern even when the pattern of an inscription varies in accordance with a device region 5p and form the individual inscription of a QFN 1 more easily than stamping.

In addition, since suspension leads 5g in a QFN 1 are formed thin by half etching, it is possible to easily process the suspension leads 5g at an identical process when a lead pattern is formed.

Successively, the assembly of a QFN 1 according to Embodiment 1 is explained.

Figure 6:
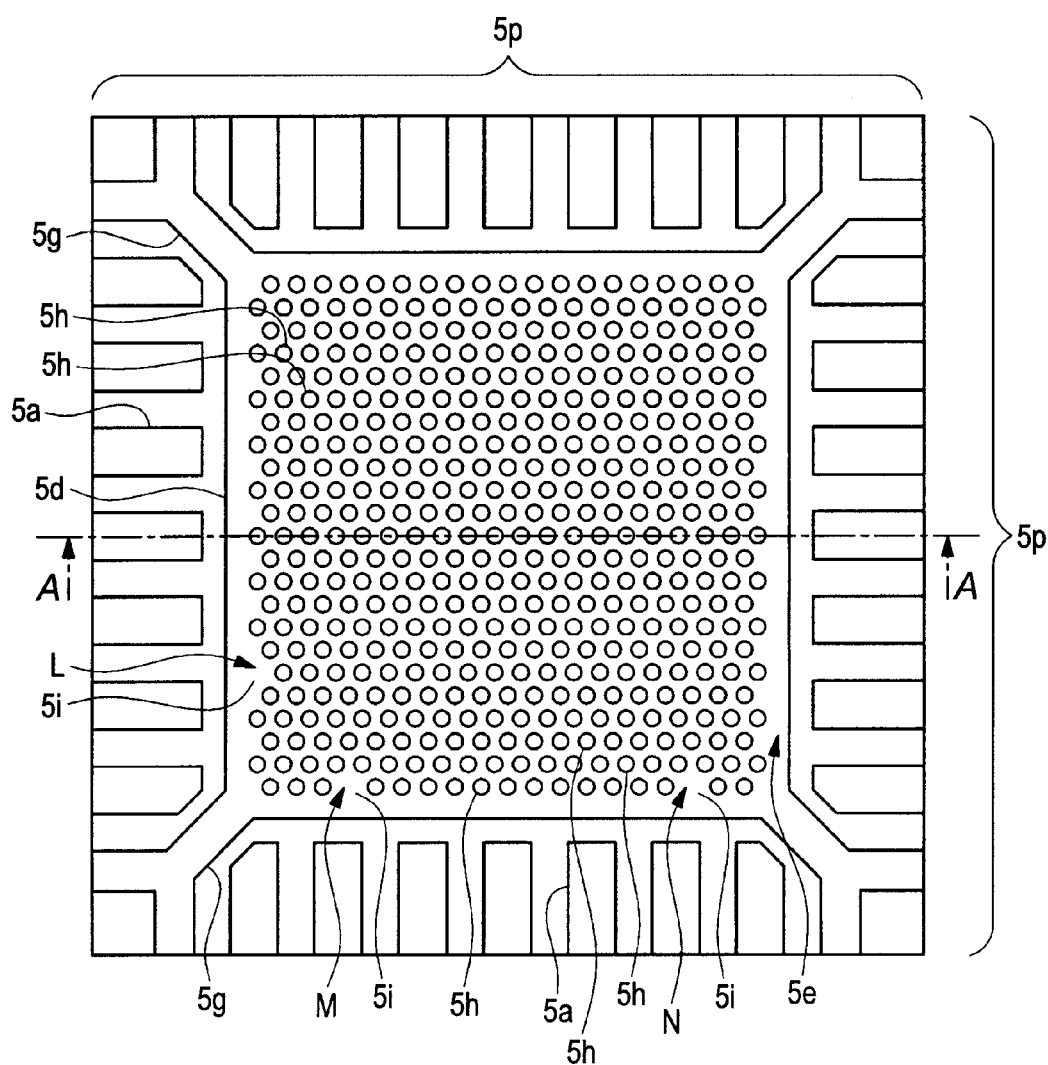
FIG. 6 is an enlarged plan view showing the structure of the section B shown in FIG. 5 in an enlarged manner.
Figure 7:
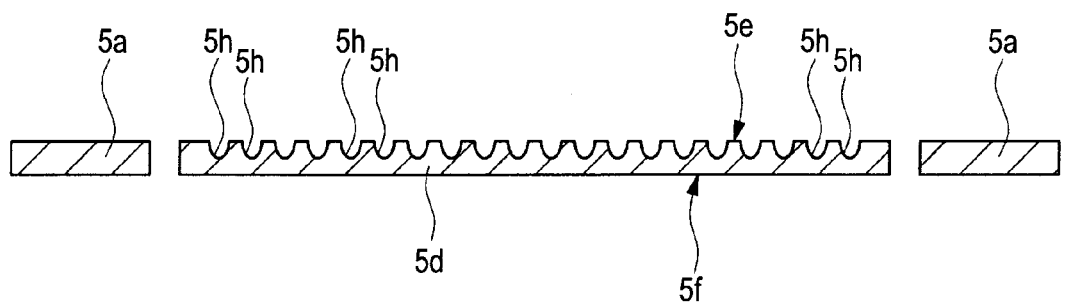
FIG. 7 is a sectional view showing a structure cut on line A-A shown in FIG. 6.
Figure 8:
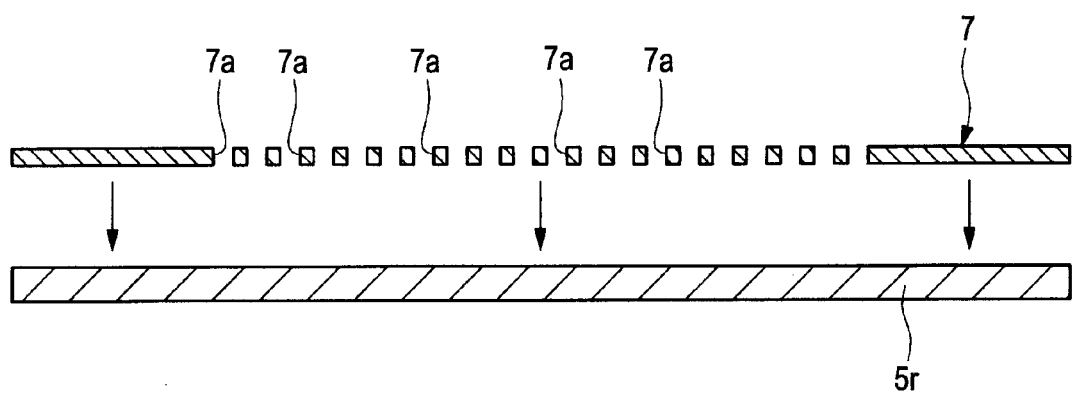
FIG. 8 is a sectional view showing the state of the lead frame shown in FIG. 5 before etching during dimple processing.
Figure 9:
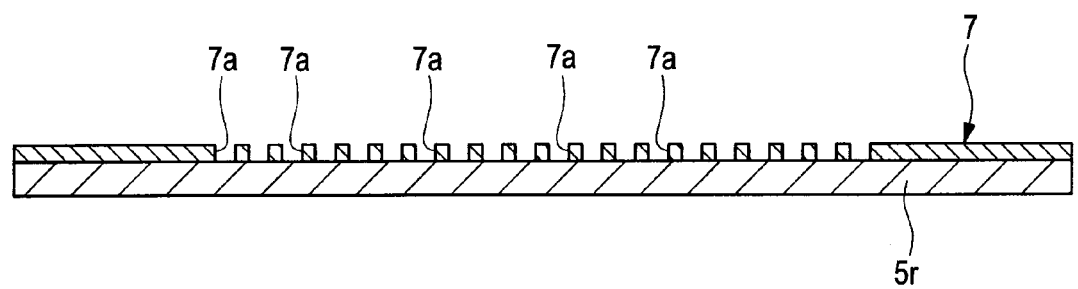
FIG. 9 is a sectional view showing the state of the lead frame shown in FIG. 5 when an etching mask is mounted during dimple processing.
Figure 10:
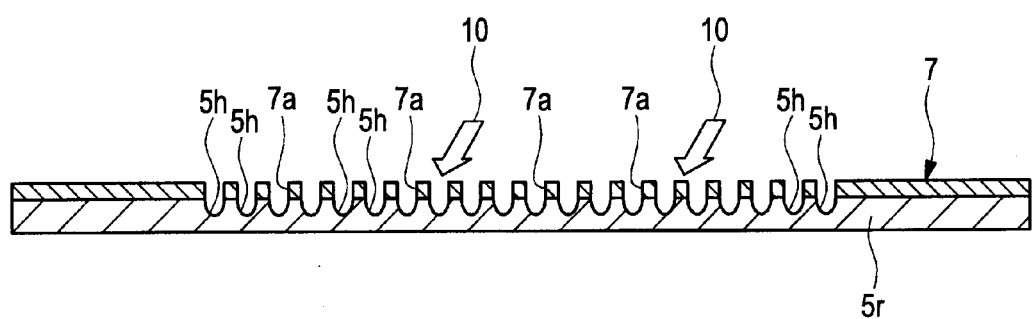
FIG. 10 is a sectional view showing the state of the lead frame shown in FIG. 5 at etching during dimple processing.
Figure 11:
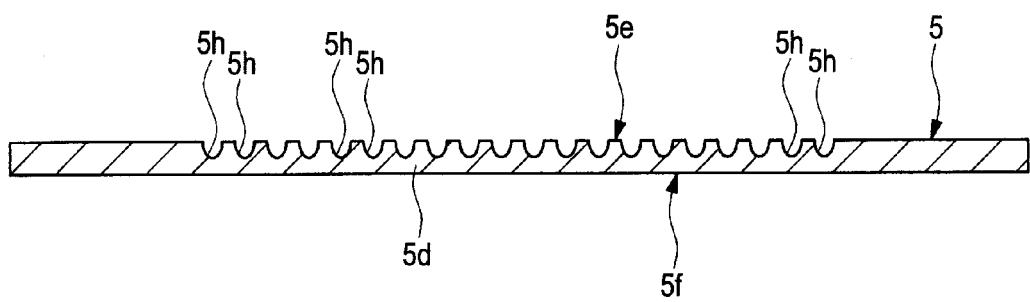
FIG. 11 is a sectional view showing the state of the lead frame shown in FIG. 5 after dimple processing.

FIG. 5 is a plan view showing an example of the structure of a lead frame used in the assembly of the semiconductor device shown in FIG. 1, FIG. 6 is an enlarged plan view showing the structure of the section B shown in FIG. 5 in an enlarged manner, FIG. 7 is a sectional view showing a structure cut on line A-A shown in FIG. 6, and FIG. 8 is a sectional view showing the state of the lead frame shown in FIG. 5 before etching during dimple processing. Further, FIG. 9 is a sectional view showing the state of the lead frame shown in FIG. 5 when an etching mask is mounted during dimple processing, FIG. 10 is a sectional view showing the state of the lead frame shown in FIG. 5 at etching during dimple processing, and FIG. 11 is a sectional view showing the state of the lead frame shown in FIG. 5 after dimple processing.

Figure 12:
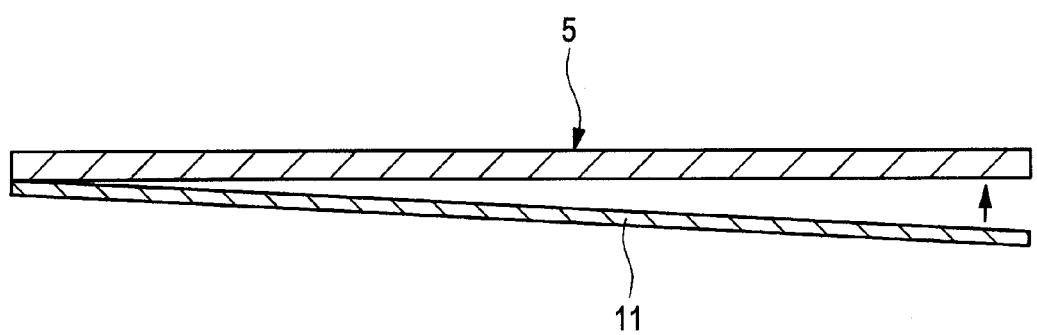
FIG. 12 is a sectional view showing an example of the structure when a polyimide tape is attached in the assembly of the semiconductor device shown in FIG. 1.
Figure 13:
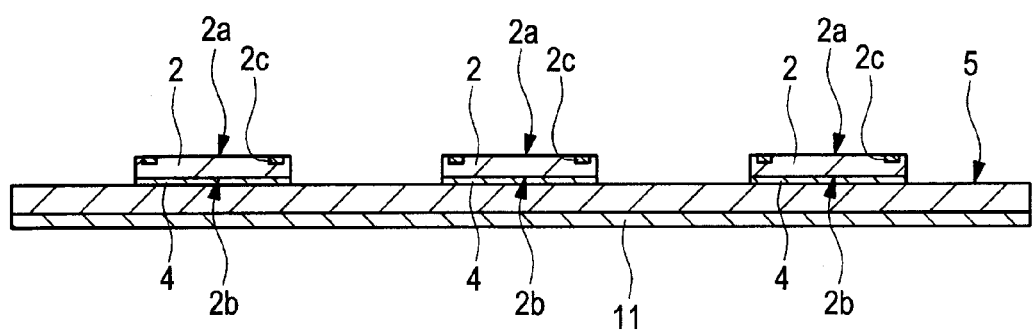
FIG. 13 is a sectional view showing an example of the structure after die bonding in the assembly of the semiconductor device shown in FIG. 1.
Figure 14:
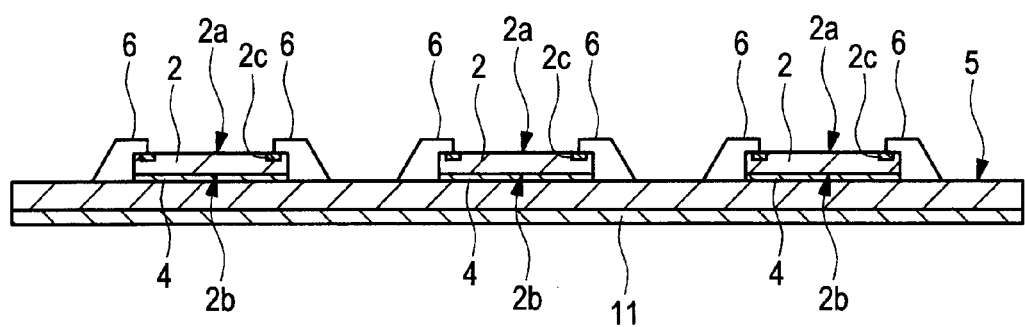
FIG. 14 is a sectional view showing an example of the structure after wire bonding in the assembly of the semiconductor device shown in FIG. 1.

Then, FIG. 12 is a sectional view showing an example of the structure when a polyimide tape is attached in the assembly of the semiconductor device shown in FIG. 1, FIG. 13 is a sectional view showing an example of the structure after die bonding in the assembly of the semiconductor device shown in FIG. 1, FIG. 14 is a sectional view showing an example of the structure after wire bonding in the assembly of the semiconductor device shown in FIG. 1, and FIG. 15 is a partial sectional view showing an example of the structure at die cramping during a resin sealing process in the assembly of the semiconductor device shown in FIG. 1.

Figure 16:
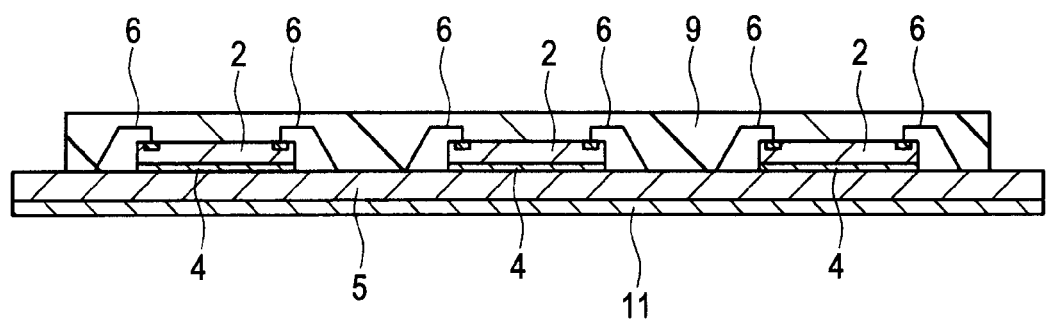
FIG. 16 is a sectional view showing an example of the structure after resin molding in the assembly of the semiconductor device shown in FIG. 1.
Figure 17:
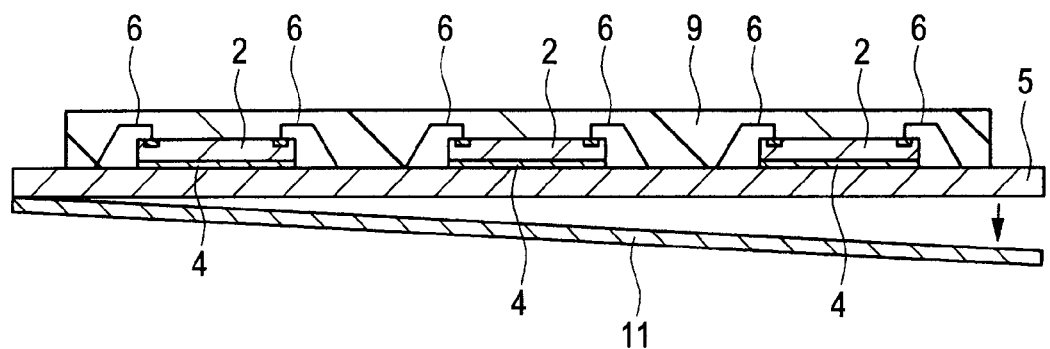
FIG. 17 is a sectional view showing an example of the structure when a polyimide tape is peeled off during a resin sealing process in the assembly of the semiconductor device shown in FIG. 1.
Figure 18:
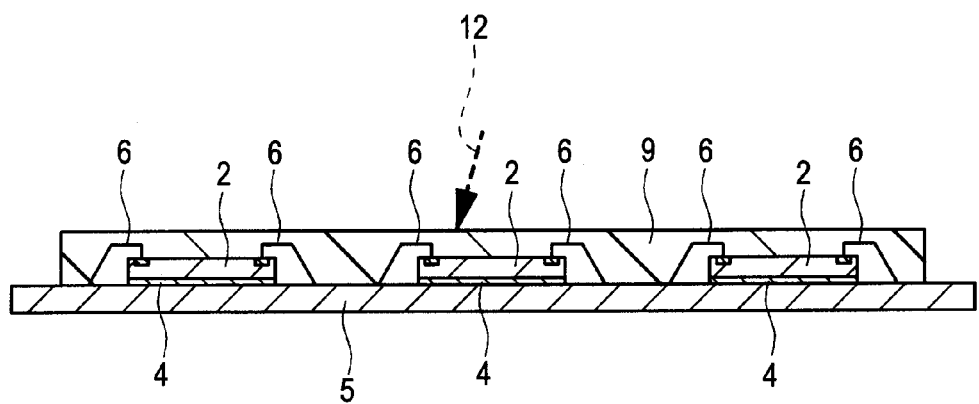
FIG. 18 is a sectional view showing an example of the structure at laser marking in the assembly of the semiconductor device shown in FIG. 1.
Figure 19:
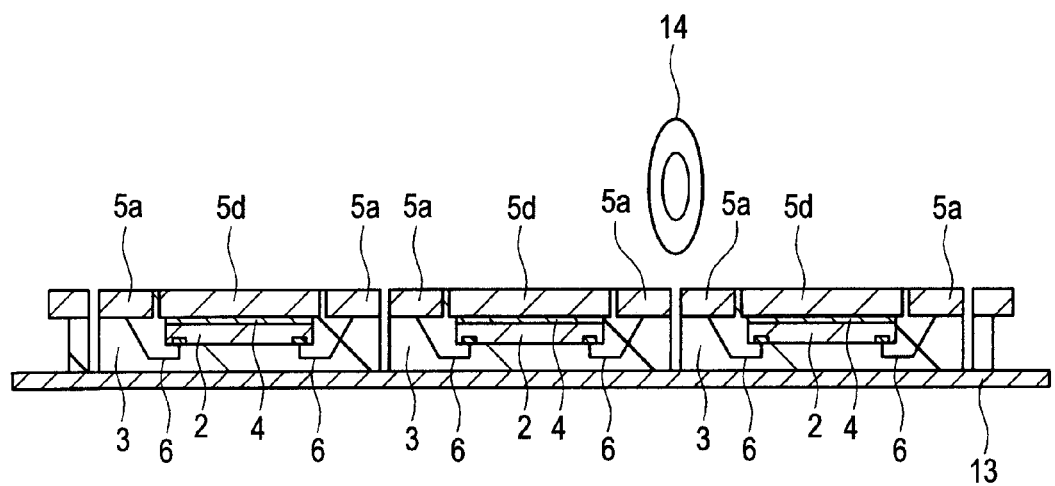
FIG. 19 is a sectional view showing an example of the structure at package dicing in the assembly of the semiconductor device shown in FIG. 1.

Further, FIG. 16 is a sectional view showing an example of the structure after resin molding in the assembly of the semiconductor device shown in FIG. 1, FIG. 17 is a sectional view showing an example of the structure when a polyimide tape is peeled off during a resin sealing process in the assembly of the semiconductor device shown in FIG. 1, FIG. 18 is a sectional view showing an example of the structure at laser marking in the assembly of the semiconductor device shown in FIG. 1, and FIG. 19 is a sectional view showing an example of the structure at package dicing in the assembly of the semiconductor device shown in FIG. 1.

A QFN 1 according to Embodiment 1 is a semiconductor device assembled by adopting a MAP method. Consequently, a lead frame 5 has mold regions 5n in each of which a plurality of device regions 5p are formed in a matrix array as shown in FIG. 5, a packaged sealing body 9 (refer to FIG. 16) is formed by using the lead frame 5 and applying resin molding in the state where the plural device regions 5p are covered with one cavity 8c of a resin molding die 8 as shown in FIG. 15, and thereafter the QFN 1 is produced by cutting the packaged sealing body 9 and the lead frame 5 together and individuating them into packages.

FIG. 5 shows the structure of a lead frame 5 having three mold regions 5n and, in each of the mold regions 5n, device regions 5p of 25 pieces (=5 pieces×5 pieces) are formed in a matrix array. For example, the section B in FIG. 5 represents one device region 5p and the detailed pattern is shown in FIGS. 6 and 7.

As shown in FIGS. 6 and 7, a plurality of dimples 5h are formed in a lattice-shaped array on the upper surface 5e of a die pad 5d and an inscription representing the positional information of a package (a device region 5p), the positional information of a cavity 8c, and the like is formed as a culled or pixel skipping pattern 5i of the dimples 5h at the outermost periphery thereof. Here, the plural dimples 5h are formed by etching.

Further, as shown in FIG. 5, the lead frame 5 has a frame portion 5j that is an outer frame to support the respective mold regions 5n and a plurality of guide holes 5k formed at the frame portion 5j.

Here, an example of the message displayed by an inscription is explained. The third dimple 5h from the bottom is culled and not formed at the section L in FIG. 6. On this occasion, "the third package position from the bottom in the Y direction in FIG. 5" is meant. Then, the fourth dimple 5h from the observers' left is culled and not formed at the section M in FIG. 6. On this occasion, "the fourth package position from the observers' left in the X direction in FIG. 5" is meant. Further, the third dimple 5h from the observers' right is culled and not formed at the section N in FIG. 6. On this occasion, "the third cavity from the observers' right in FIG. 5" is meant.

That is, when the information of the culled or pixel skipping pattern 5i of the dimples 5h at the sections L, M, and N shown in FIG. 6 is matched to one lead frame 5 shown in FIG. 5, it means: in the mold region 5n corresponding to the third cavity from the right as shown by the section N, the fourth package position (a device region 5p) from the left in the X direction as shown by the section M and the third package position (a device region 5p) from the bottom in the Y direction as shown by the section L; and thus the device region 5p (the package position) of the section B in FIG. 5.

Here, a frame base material 5r shown in FIG. 8 for forming a lead frame 5 is made of copper alloy for example and the thickness thereof is about 0.15 to 0.2 mm for example.

Successively, etching applied to the frame base material 5r when the lead frame 5 is formed is explained. That is, in the etching for forming the lead frame 5, the respective leads 5a and suspension leads 5g of the lead frame 5 are processed, the suspension leads 5g are subjected to half etching, moreover the die pad 5d and others are processed, and simultaneously the plural dimples 5h on the die pad 5d are formed.

Firstly, as shown in FIGS. 8 and 9, an etching mask 7 where a desired pattern 7a is formed is placed over the frame base material 5r. Successively, as shown in FIG. 10, a prescribed etching liquid 10 is applied from above the etching mask 7 and etching is applied.

By so doing, the sites of the frame base material 5r to which the etching liquid 10 adheres are shaved, a lead pattern and the like are formed, and a plurality of dimples 5h are also formed as shown in FIG. 11. That is, by the etching, it is possible to simultaneously form a desired lead pattern, plural dimples 5h as an inscription, and plural dimples 5h disposed below the bottom of a chip.

Successively, the assembly of a package (a QFN 1) is explained.

Firstly, a lead frame 5 shown in FIG. 5 in which a plurality of device regions 5p, each of which includes a die pad 5d and a plurality of leads 5a disposed around the die pad 5d, are formed in a matrix array and an inscription is formed on the upper surface 5e of each of the die pads 5d is prepared. A plurality of dimples 5h are formed on the upper surface 5e of a die pad 5d in a lattice-shaped array as shown in FIG. 6 and a culled or pixel skipping pattern 5i of the dimples 5h is formed at the outermost periphery as the inscription. Here, the plural dimples 5h are formed by etching.

That is, a lead frame 5 is configured by: forming a plurality of dimples 5h on the upper surface 5e of a die pad 5d in a lattice-shaped array; and also forming outermost dimples 5h having a culled or pixel skipping pattern 5i as an inscription, other plural dimples 5h in a region corresponding to the rear surface of a chip, and a lead pattern by etching at the same time (in an identical process).

Successively, as shown in FIG. 12, a polyimide tape 11 is attached to the rear surface (the surface on the same side as the lower surface 5f of the die pad 5d) of the lead frame 5. The purpose of the polyimide tape 11 is to prevent a resin for sealing from going around to the lower surface 5f of the die pad 5d and the rear surfaces of leads at resin molding and the polyimide tape 11 is attached to the lead frame 5 at least before die bonding is applied.

Successively, die bonding is applied as shown in FIG. 13. Here, a semiconductor chip 2 is mounted over the upper surface 5e of each of the plural die pads 5d in each of the mold regions 5n of the lead frame 5 shown in FIG. 5 with a die bond material interposed in between. Here, the die bond material is a paste material 4 such as a silver paste.

Further, when the upper surface 5e of a die pad 5d is coated with the paste material 4, as shown in FIG. 2, the paste material 4 is applied so that the outermost dimples 5h as an inscription may be located at positions outside the coating region 5q of the paste material 4.

By so doing, the rear surface 2b of the semiconductor chip 2 is fastened to the upper surface 5e of the die pad 5d with the paste material 4 interposed in between. On this occasion, since plural dimples 5h are formed on the upper surface 5e of the die pad 5d in the region corresponding to the rear surface 2b of the semiconductor chip 2, it is possible to embed the paste material 4 into the plural dimples 5h and improve the adhesiveness between the paste material 4 and the die pad 5d.

Successively, as shown in FIG. 14, wire bonding is applied. Here, as shown in FIG. 2, electrode pads 2c that are the plural surface electrodes of the semiconductor chip 2 mounted over the die pad 5d are electrically coupled to leads 5a through conductive wires 6. Here, the conductive wires 6 are gold wires for example.

Successively, resin molding shown in FIG. 15 is applied. Here, the plural device regions 5p (refer to FIG. 5) in the lead frame 5 having been subjected to wire bonding are covered with one cavity 8c of a resin molding die 8 and sealed with a resin and a packaged sealing body 9 shown in FIG. 16 is formed.

At the time of resin molding, the lead frame 5 having been subjected to wire bonding is disposed over a lower die 8b of the resin molding die 8 and thereafter the lower die 8b and an upper die 8a are clamped. Thereby, resin sealing is applied in the state where the plural device regions 5p (refer to FIG. 5) are covered with one cavity 8c as shown in FIG. 15 and the polyimide tape 11 attached to the lead frame 5 is closely attached to the die surface of the lower die 8b. A resin for sealing is supplied into the cavity 8c in the state and a packaged sealing body 9 shown in FIG. 16 is formed. Here, the resin for sealing is a thermosetting epoxy resin or the like for example.

By applying resin molding in the state where the polyimide tape 11 attached to the lead frame 5 is closely attached to the die surface of the lower die 8b as stated above, it is possible to: prevent the resin for sealing from going around to the lower surface 5f of the die pad 5d and the rear surfaces of leads at resin molding; and prevent the resin for sealing from sticking to the lower surface 5f of the die pad 5d and the rear surfaces of the leads.

After the resin for sealing is charged, the resin for sealing is thermally cured and the packaged sealing body 9 is formed. Further, after finishing forming the packaged sealing body 9, the polyimide tape 11 is peeled off from the lead frame 5 as shown in FIG. 17.

Successively, marking shown in FIG. 18 is applied. In this process, the marking is applied with a laser 12 for example. That is, the surface of the packaged sealing body 9 is marked by irradiating the surface of the packaged sealing body 9 with the laser 12. Here, the mark represents the name, the lot number, and the like of a product for example.

Successively, package individuation shown in FIG. 19 is carried out. In this process, the packaged sealing body 9 is cut, separated, and thus individuated into respective semiconductor devices (QFNs 1) by dicing. On this occasion, packages are individuated by: firstly attaching a dicing tape 13 to the upper surface of the packaged sealing body 9; directing the side of the packaged sealing body 9 facing the lead frame 5 upward by reversing the upper surface and the lower surface; advancing a blade 14 for dicing from above the lead frame 5 in the state; and cutting and separating the lead frame 5 and the packaged sealing body 9 with the blade 14.

Through the above processes, the assembly of the QFN 1 shown in FIGS. 1 to 4 is completed.

By a method for producing a QFN 1 according to Embodiment 1, an inscription representing the positional information of a package, the positional information of a cavity 8c, and the like is formed as a culled or pixel skipping pattern 5i of dimples 5h on the upper surface 5e of a die pad 5d and hence it is possible to confirm the culled or pixel skipping pattern 5i of the dimples 5h by X-ray inspection or the like even after the individuation of packages.

By so doing, it is possible to specify a cavity 8c of a resin molding die 8. Further, it is also possible to specify the position of a device region 5p (a package position) in a lead frame 5.

As a result, it is possible to sort a defective QFN 1 by appearance inspection when a defect appears in the assembly of a QFN (a semiconductor device) 1 and it is possible to improve quality control in the assembly of a QFN 1. Further, it is possible to confirm history and trends at each of the processes of the QFN 1 where a defect appears. Thereby, it is possible to easily pursue the cause of the defect.

Further, since an inscription formed on a die pad 5d of a lead frame 5 is formed with a culled or pixel skipping pattern 5i of dimples 5h and the dimples 5h are formed by etching, when the lead pattern of respective leads 5a, a die pad 5d, and the like is formed by etching in the processing of the lead frame 5, the plural dimples 5h can be formed together through the same etching.

That is, it is possible to form plural dimples 5h by etching at the same time when a lead frame is formed and easily form an inscription with a special process not added.

Embodiment 2

Figure 20:
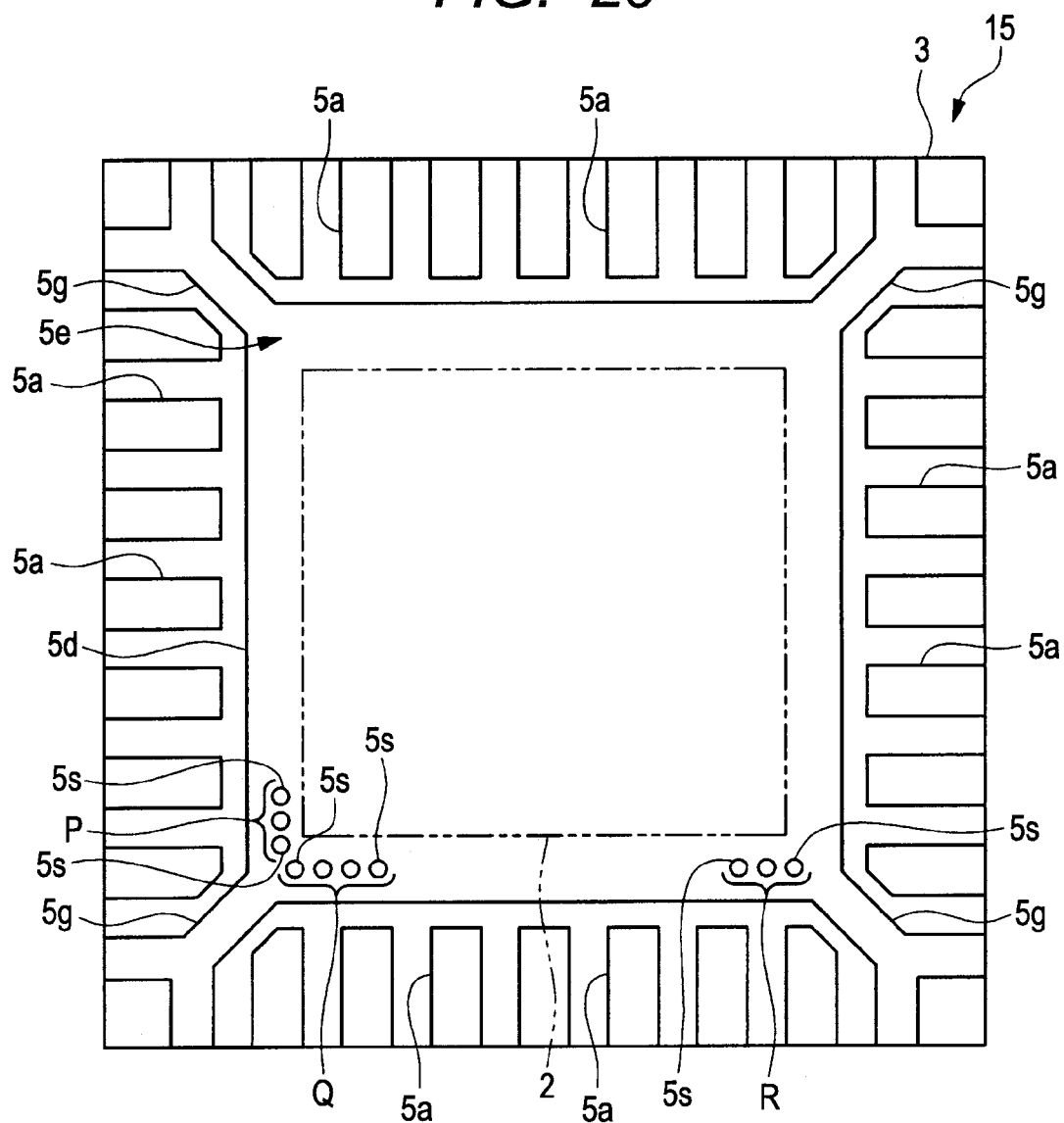
FIG. 20 is a plan view showing an example of the shape of an inscription in a semiconductor device according to Embodiment 2 of the present invention.
Figure 21:
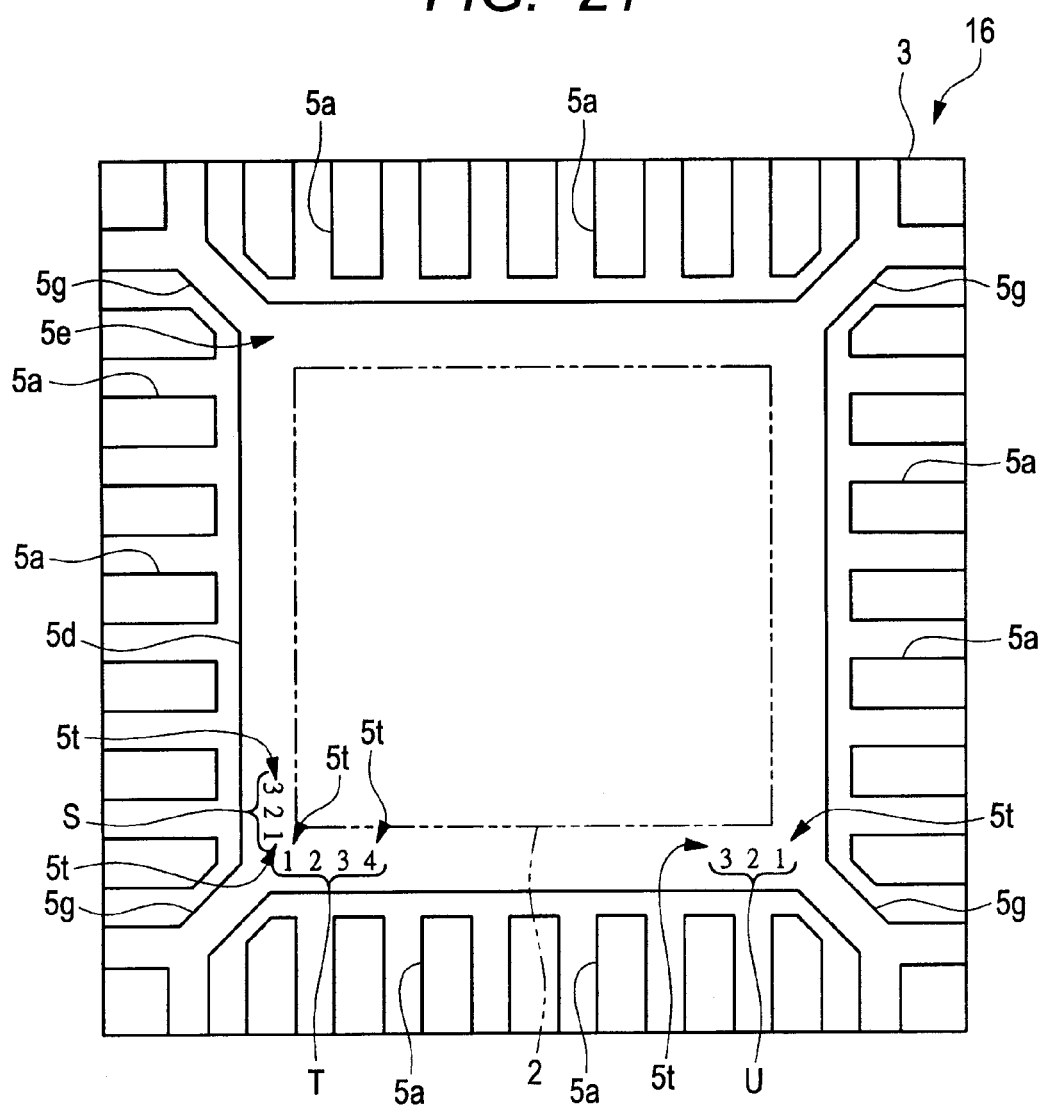
FIG. 21 is a plan view showing the shape of an inscription in a semiconductor device according to a modified example of Embodiment 2 of the present invention.

FIG. 20 is a plan view showing an example of the shape of an inscription in a semiconductor device according to Embodiment 2 of the present invention, and FIG. 21 is a plan view showing the shape of an inscription in a semiconductor device according to a modified example of Embodiment 2 of the present invention.

The semiconductor device according to Embodiment 2 shown in FIG. 20 is a QFN 15 similar to the QFN 1 according to Embodiment 1 but the differences from the QFN 1 are: that the dimples 5h representing an inscription formed on a die pad 5d do not form the culled or, pixel skipping pattern 5i shown in FIG. 4 but form an aligned pure dimple array; and that dimples 5h are not formed in the region of the die pad 5d corresponding to the rear surface of a chip.

That is, only the dimples 5s for inscription are disposed in the manner of forming a dimple array and other dimples 5h are not formed at all. On this occasion, the plural dimples 5s for inscription are formed preferably at positions on the die pad 5d outside the semiconductor chip 2 in the same way as the QFN 1 but may be formed in the region of the die pad 5d corresponding to the rear surface of the chip.

In the case of the inscription on the die pad 5d shown in FIG. 20 for example, the sections P and Q represent information on the package position (the positional information of a semiconductor device in a cavity 8c of a resin molding die 8 shown in FIG. 15) on a frame respectively and the section R represents cavity information.

Firstly, at the section P, dimples 5s for inscription are formed up to the third from the bottom. On this occasion, "the third package position from the bottom in the Y direction" in the lead frame 5 shown in FIG. 5 is meant. Further, at the section Q in FIG. 20, dimples 5s for inscription are formed up to the fourth from the observers' left. On this occasion, "the fourth package position from the observers' left in the X direction" in FIG. 5 is meant. Then, at the section R in FIG. 20, dimples 5s for inscription are formed up to the third from the observers' right. On this occasion, "the third cavity from the observers' right" is meant.

That is, when the information of the dimples 5s for inscription at the sections P, Q, and R shown in FIG. 20 is matched to one lead frame 5 shown in FIG. 5, it means: in the mold region 5n corresponding to the third cavity from the right as shown by the section R, the fourth package position (a device region 5p) from the left in the X direction as shown by the section Q and the third package position (a device region 5p) from the bottom in the Y direction as shown by the section P; and thus the device region 5p (the package position) of the section B in FIG. 5 in the same way as FIG. 4.

Consequently, also in the QFN 15 according to Embodiment 2, the dimples 5s for inscription representing the positional information of a package, the positional information of a cavity 8c, and the like are formed on the upper surface 5e of the die pad 5d and hence it is possible to confirm the inscription by X-ray inspection or the like and identify a cavity 8c of a resin molding die 8 even after the individuation of packages. Further, it is possible also to identify the position of a device region 5p (a package position) in a lead frame 5.

By so doing, it is possible to sort a defective QFN 15 by appearance inspection when a defect appears in the assembly of a QFN (a semiconductor device) 15 and it is possible to improve quality control in the assembly of a QFN 15. Further, it is possible to confirm history and trends at each of the processes of the QFN 15 where a defect appears.

Other structure and effects of the QFN 15 according to Embodiment 2 are the same as those of the QFN 1 according to Embodiment 1 and hence the duplication of explanations is omitted.

Successively, a modified example of Embodiment 2 is explained.

The semiconductor device according to a modified example of Embodiment 2 shown in FIG. 21 is a QFN 16 similar to the QFN 1 according to Embodiment 1 but the differences from the QFN 1 are: that an inscription formed on a die pad 5d is represented with codes (alphanumeric characters for example) 5t; and that dimples 5h are not formed in the region of the die pad 5d corresponding to the rear surface of a chip in the same way as the QFN 15.

That is, an inscription is represented with the codes 5t such as alphanumeric characters. On this occasion, in the same way as the QFN 1, the plural codes 5t are formed preferably at positions on the die pad 5d outside the semiconductor chip 2 but may be formed in the region of the die pad 5d corresponding to the rear surface of the chip.

In the case of the inscription (the codes 5t) on the die pad 5d shown in FIG. 21 for example, the sections S and T represent information on the package position (the positional information of a semiconductor device in a cavity 8c of a resin molding die 8 shown in FIG. 15) on a frame respectively and the section U represents cavity information.

Firstly, at the section S, the codes 5t of 1, 2, and 3 are indicated from the bottom. On this occasion, "the third package position from the bottom in the Y direction" in the lead frame 5 shown in FIG. 5 is meant. Further, at the section T in FIG. 21, the codes 5*t* of 1, 2, 3, and 4 are indicated from the observers' left. On this occasion, "the fourth package position from the observers' left in the X direction" in FIG. 5 is meant. Then, at the section U in FIG. 21, the codes 5*t* of 1, 2, and 3 are indicated from the observers' right. On this occasion, "the third cavity from the observers' right" is meant.

That is, when the information of the inscription (the codes 5*t*) at the sections S, T, and U shown in FIG. 21 is matched to one lead frame 5 shown in FIG. 5, it means: in the mold region 5*n* corresponding to the third cavity from the right as shown by the section U, the fourth package position (a device region 5*p*) from the left in the X direction as shown by the section T and the third package position (a device region 5*p*) from the bottom in the Y direction as shown by the section S; and thus the device region 5*p* (the package position) of the section B in FIG. 5 in the same way as FIG. 4.

Consequently, also in the QFN 16 according to a modified example of Embodiment 2, the inscription (the codes 5*t*) representing the positional information of a package, the positional information of a cavity 8*c*, and the like is formed on the upper surface 5*e* of the die pad 5*d* and hence it is possible to confirm the inscription by X-ray inspection or the like and identify a cavity 8*c* of a resin molding die 8 even after the individuation of packages. Further, it is possible also to identify the position of a device region 5*p* (a package position) in a lead frame 5.

By so doing, it is possible to sort a defective QFN 16 by appearance inspection when a defect appears in the assembly of a QFN (a semiconductor device) 16 and it is possible to improve quality control in the assembly of a QFN 16. Further, it is possible to confirm history and trends at each of the processes of the QFN 16 where a defect appears.

Other structure and effects of the QFN 16 according to Embodiment 2 are the same as those of the QFN 1 according to Embodiment 1 and hence the duplication of explanations is omitted.

The invention established by the present inventors has heretofore been explained concretely on the basis of the embodiments according to the present invention but it will be obvious that the present invention is not limited to the above embodiments according to the present invention and various changes may be made within the range not departing from the scope of the present invention.

For example, although the explanations are made on the basis of the case where the semiconductor device is a QFN in Embodiments 1 and 2, the semiconductor device may be not a QFN but an SON (Small Outline Non-leaded Package) or the like as long as it is a semiconductor device that uses a lead frame, is assembled by a MAP method, and has an inscription comprising dimples 5*h* or codes 5*t* formed on a die pad 5*d*.

Further, the number of the mold regions 5*n* formed in one lead frame 5 is not limited to three and may be at least one, namely may be any number.

The present invention is suitable for the assembly of a semiconductor device adopting a MAP method.

What is claimed is:

1. A semiconductor device comprising:
   a semiconductor chip having a main surface, a rear surface opposite said main surface, and a plurality of surface electrodes formed over said main surface;
   a sheet-shaped chip mounting portion having a upper surface over which said semiconductor chip is mounted with a die bond material interposed therebetween and a lower surface opposite said upper surface;
   a plurality of leads formed at the periphery of said chip mounting portion, each said lead having an inner portion and an outer portion;
   a plurality of conductive wires electrically coupling said leads to said surface electrodes of said semiconductor chip; and
   a sealing body to seal said semiconductor chip, said inner portions of said leads, and said conductive wires with resin,
   wherein said outer portions of said leads are exposed from a rear surface of said sealing body, and
   wherein an inscription is formed on said upper surface of said chip mounting portion, said inscription having a portion defined by a first plurality of dimples arranged in a first direction, the arrangement of dimples in the first direction including a pixel skipping pattern to provide address information of the semiconductor device.

2. A semiconductor device according to claim 1, wherein said inscription is formed by etching.

3. A semiconductor device according to to claim 2, wherein said die bond material is a paste material.

4. A semiconductor device according to claim 3, wherein said inscription is formed at a position outside a region where said paste material is applied.

5. A semiconductor device according to claim 4, wherein a second plurality of dimples is formed in a region of said upper surface of said chip mounting portion corresponding to said rear surface of said semiconductor chip.

6. A semiconductor device according to claim 1,
   wherein said semiconductor device has suspension leads leading to said chip mounting portion, and
   wherein said suspension leads are embedded in said sealing body.

7. A semiconductor device according to claim 6, wherein said inscription is not formed over said suspension leads.

8. A semiconductor device according to claim 7, wherein said inscription includes a portion providing cavity information regarding a resin molding die to form said sealing body.

9. A method for producing a plurality of semiconductor devices comprising the steps of:
   (a) preparing a lead frame having a plurality of device regions, each device region including a chip mounting portion having an upper surface on which an inscription is formed, a plurality of leads being disposed at a periphery of each said chip mounting portion;
   (b) mounting a respective semiconductor chip over said upper surface of each of said chip mounting portions with a die bond material interposed therebetween;
   (c) electrically coupling surface electrodes of each said semiconductor chip to the corresponding leads through conductive wires;
   (d) forming a package sealing body by arranging said device regions of said lead frame within one cavity of a resin molding die and sealing said device regions with resin to form said package sealing body; and
   (e) dividing said package sealing body and forming into individual semiconductor devices,
   wherein each said inscription has a portion defined by a first plurality of dimples arranged in a first direction, the arrangement of dimples in the first direction including a pixel skipping pattern to provide address information of the semiconductor device.

10. A method for producing a semiconductor device according to claim 9, wherein each said inscription is formed by etching.

11. A method for producing a semiconductor device according to claim 10, wherein said die bond material is a paste material, and wherein each said inscription is formed at a position outside a region where said paste material is applied.

12. A method for producing a semiconductor device according to claim 11, wherein a second plurality of dimples is formed on said upper surface of each said chip mounting portion, and wherein at said step (a), said lead frame and said first and second plurality of dimples are formed at a same time.

* * * * *